(12) United States Patent
You et al.

(10) Patent No.: US 9,514,849 B2
(45) Date of Patent: Dec. 6, 2016

(54) SEMICONDUCTOR MEMORY DEVICE INCLUDING CONTROLLER AND FUSE CIRCUITS FOR PERFORMING REPAIR OPERATION

(71) Applicant: SK hynix Inc., Gyeonggi-do (KR)

(72) Inventors: Jung-Taek You, Gyeonggi-do (KR); Byeong-Chan Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/855,071

(22) Filed: Sep. 15, 2015

(65) Prior Publication Data
US 2016/0300627 A1    Oct. 13, 2016

(30) Foreign Application Priority Data

Apr. 7, 2015    (KR) .................. 10-2015-0048925

(51) Int. Cl.
| | | |
|---|---|---|
| *G11C 7/00* | (2006.01) | |
| *G11C 29/00* | (2006.01) | |
| *G11C 8/06* | (2006.01) | |
| *G11C 8/12* | (2006.01) | |
| *G11C 8/18* | (2006.01) | |
| *G11C 5/14* | (2006.01) | |
| *G11C 17/16* | (2006.01) | |

(52) U.S. Cl.
CPC .............. *G11C 29/78* (2013.01); *G11C 5/148* (2013.01); *G11C 8/06* (2013.01); *G11C 8/12* (2013.01); *G11C 8/18* (2013.01); *G11C 17/16* (2013.01); *G11C 29/76* (2013.01); *G11C 29/785* (2013.01)

(58) Field of Classification Search
CPC ....... G11C 29/785; G11C 17/16; G11C 17/18; G11C 29/44; G11C 29/808; G11C 29/787; G11C 29/846
USPC ................................ 365/96, 200, 201, 225.7
See application file for complete search history.

(56) References Cited

U.S. PATENT DOCUMENTS

| | | | |
|---|---|---|---|
| 7,768,847 B2 * | 8/2010 | Ong ..................... | G11C 29/802 365/200 |
| 8,423,839 B2 | 4/2013 | Yoel et al. | |
| 8,537,627 B2 * | 9/2013 | Ouellette ............. | G11C 29/787 365/200 |

FOREIGN PATENT DOCUMENTS

KR    1020130077629    7/2013

* cited by examiner

*Primary Examiner* — David Lam
(74) *Attorney, Agent, or Firm* — IP & T Group LLP

(57) ABSTRACT

A semiconductor memory device includes a first fuse set block including a fuse array for storing first repair information, and a control block configured to store second repair information in a first mode, and generate an output control signal when input addresses applied from an external source and the second repair information are the same, in a second mode, wherein the first fuse set block enables a first match signal for accessing a first redundancy memory cell when the stored first repair information and the input addresses are the same, and disables the first match signal in response to the output control signal.

18 Claims, 8 Drawing Sheets

SEMICONDUCTOR MEMORY DEVICE INCLUDING CONTROLLER AND FUSE CIRCUITS FOR PERFORMING REPAIR OPERATION

CROSS-REFERENCE TO RELATED APPLICATION

This application claims priority under 35 U.S.C, §119 to Korean Patent Application No, 10-2015-0048925 filed on Apr. 7, 2015 in the Korean Intellectual Property Office, the disclosure of which is incorporated herein by reference in its entirety.

TECHNICAL FIELD

Exemplary embodiments relate to a semiconductor design technology and, more particularly, to a semiconductor memory device which performs a repair operation.

DISCUSSION OF THE RELATED ART

Repair operations for defective memory cells of semiconductor memory devices are divided into repair operations that are performed at the wafer stage and repair operations performed at the package stage. Packager stage repair operations are referred to as post package repair (PPR) operations.

Semiconductor memory devices include fuse circuits capable of programming addresses of repair target memory cells, that is, defective memory cells that need to be substituted with redundancy memory cells. Fuse circuits store addresses (i.e., repair addresses) of repair target memory cells to access redundancy memory cells instead of the repair target memory cells.

In a repair operation, when an attempt is made at accessing repair target memory cells, a programmed repair address is substituted and redundancy memory cells are accessed instead.

FIG. 1 is a diagram illustrating fuse sets included in a conventional fuse circuit.

Referring to FIG. 1, fuse sets include a plurality of normal fuse sets 111 to 115 allocated to store repair address information at a wafer level stage and a PPR fuse set 116 that stores repair addresses at a package level.

A PPR operation is performed for a repair operation. The semiconductor memory device enters a PPR mode, and performs the PPR operation of storing the repair address information, which is input from an external source, in the PPR fuse set 116.

In a soft-post package repair (soft-PPR: SPPR) mode, which is one of the PPR modes, the repair address information input from an external source is stored or latched in a register. When the time required for a repair operation is shortened in the SPPR mode, the effect of the repair operation is lost when the power supply is interrupted.

FIG. 2 is a diagram to assist in explaining an SPPR operation of a conventional semiconductor memory device.

Referring to FIG. 2, a semiconductor memory device includes a normal fuse set 210, a PPR fuse set 220, a first comparison unit 230, and a second comparison unit 240.

For example, repair addresses ADDRESS<4> and ADDRESS<6> are stored in the normal fuse set 210 by the repair operation performed in the fabrication stage.

The semiconductor memory device receives an address ADDRESS<4> as an input address EX_ADD, from an external source. The first comparison unit 230 receives the stored repair address from the normal fuse set 210 and the input address EX_ADD and performs a comparison operation. The first comparison unit 230 outputs a first match signal MATCH_NM which is enabled, because the repair address ADDRESS<4> stored in the normal fuse set 210 and the address ADDRESS<4> as the input address EX_ADD are the same. The semiconductor memory device may properly access a redundancy memory cell which is disposed in a redundancy region, in response to the enabled first match signal MATCH_NM.

However, if the redundancy memory cell corresponding to the address ADDRESS<4> is defective, the semiconductor memory device determines the memory cell corresponding to the address ADDRESS<4> to be a defective memory cell. The user may store the corresponding address ADDRESS<4> in the PPR fuse set 220 through an SPPR mode. In this case, the semiconductor memory device enters the SPPR mode in response to an SPPR command received from the external source and it is applied with a repair address ADDRESS<4> and stores the repair address ADDRESS<4> in the PPR fuse set 220.

Thereafter, when the semiconductor memory device receives the address ADDRESS<4> as the input address EX_ADD from the external source, the first and second comparison units 230 and 240 simultaneously generate the first match signal MATCH_NM and a second match signal MATCH_PPR so that the repair address ADDRESS<4> stored in the normal fuse set 210 and the repair address ADDRESS<4> latched in the PPR fuse set 220 are the same as the input address EX_ADD. As a result, the redundancy memory cell corresponding to the first match signal MATCH_NM and a redundancy memory cell corresponding to the second match signal MATCH_PPR are simultaneously accessed.

In summary, when the repair address stored in the PPR fuse set 220 through the SPPR mode by the user and the repair address stored in the normal fuse set 210 during the fabrication stage correspond, the redundancy memory cell corresponding to the PPR fuse set 220 and the redundancy memory cell corresponding to the normal fuse set 210 may be simultaneously accessed, and a read failure may occur during a normal operation.

SUMMARY

Various embodiments are directed to a semiconductor memory device for preventing errors in a normal operation due to accessing redundancy memory cells.

In an embodiment a semiconductor memory device may include a first fuse set block including a fuse array for storing first repair information, and a control block suitable for storing second repair information in a first mode, and generating an output control signal when input addresses applied from an external source and the second repair information are the same, in a second mode, wherein the first fuse set block enables a first match signal for accessing a first redundancy memory cell when the stored first repair information and the input addresses are the same, and disables the first match signal in response to the output control signal.

The semiconductor memory device may further include a second fuse set block suitable for storing the second repair information, and enabling a second match signal for accessing a second redundancy memory cell when the second repair information and the input addresses are the same in response to the output control signal.

The control block may include a latch enable signal generation unit suitable for generating a latch enable signal when a soft-post package repair (SPPR) setting signal is enabled in the first mode, a latch unit suitable for latching the second repair information in response to the latch enable signal, a comparison unit suitable for comparing first latched addresses outputted from the latch unit and the input addresses, respectively, and an output unit suitable for generating the output control signal corresponding to a comparison result from the comparison unit.

The semiconductor memory device may further include a bank selection block suitable for transferring the latch enable signal to a bank corresponding to a bank address of the second repair information in response to the latch enable signal.

The latch unit may include a bank address latch section suitable for storing a bank address of the second repair information, and a row address latch section suitable for storing a row address of the second repair information.

The first fuse set block may include a normal fuse latch unit suitable for latching the first repair information outputted from the fuse array, in response to a boot-up enable signal, and a first match signal generation unit suitable for comparing second latched addresses outputted from the normal fuse latch unit and the input addresses, and generating the first match signal in response to a comparison result, a normal fuse set enable signal of the first repair information and the output control signal.

The first match signal generation unit may include a first address comparison unit suitable for comparing the input addresses and the second latched addresses, and generating a first comparison result signal, a first output enable signal generation unit suitable for generating a first output enable signal in response to the normal fuse set enable signal and the output control signal, and disabling the first output enable signal when the output control signal is enabled, and a first output unit suitable for generating the first match signal in response to the first output enable signal and the first comparison result signal.

The second fuse set block may include a fuse latch unit suitable for latching the second repair information in response to the latch enable signal in the first mode, and a second match signal generation unit suitable for comparing third latched addresses outputted from the fuse latch unit and the input addresses, and generating the second match signal in response to a comparison result and the output control signal.

The second match signal generation unit may include a second address comparison unit suitable for comparing the input addresses and the third latched addresses, and generating a second comparison result signal, a second output enable signal generation unit suitable for generating a second output enable signal in response to the output control signal, and a second output unit suitable for generating the second match signal corresponding to the second comparison result signal in response to the second output enable signal.

The first mode may be a repair operation mode performed after packaging, and the second mode is a normal operation mode.

In an embodiment, a semiconductor memory device may include a plurality of memory banks each including one or more first fuse set blocks for storing first repair information and one or more second fuse set blocks for storing second repair information in a first mode a control block suitable for generating a latch enable signal and storing row and bank addresses of the second repair information in the first mode, and generating an output control signal in a second mode when input addresses applied from an external source and the second repair information are the same, and a bank selection block suitable for transferring the latch enable signal to a corresponding bank among the memory banks in response to the bank address, wherein, in the second mode, the first fuse set block enables a first match signal for accessing a first redundancy memory cell when the stored first repair information and the input addresses are the same, and disables the first match signal in response to the output enable signal.

The second fuse set block may store the row addresses of the second repair information in response to the latch enable signal, and enables a second match signal for accessing a second redundancy memory cell when the row addresses and the input addresses are the same in response to the output control signal.

The control block may include a latch enable signal generation unit suitable for generating the latch enable signal when a soft-post package repair (SPPR) setting signal is enabled in the first mode, a latch unit suitable for latching the row and bank addresses of the second repair information in response to the latch enable signal, a comparison unit suitable for comparing first latched addresses outputted from the latch unit and the input addresses, respectively, and an output unit suitable for generating the output control signal corresponding to a comparison result from the comparison unit.

The latch unit may include a bank address latch section suitable for storing the bank address of the second repair information, and a row address latch section suitable for storing the row addresses of the second repair information.

The first fuse set block may include a fuse array suitable for storing the first repair information, a normal fuse latch unit suitable for latching the first repair information outputted from the fuse array, in response to a boot-up enable signal, and a first match signal generation unit suitable for comparing second latched addresses outputted from the normal fuse latch unit and the input addresses, and generating the first match signal in response to a comparison result, a normal fuse set enable signal of the first repair information and the output control signal.

The first match signal generation unit may include a first address comparison unit suitable for comparing the input addresses and the second latched addresses, and generating a first comparison result signal, a first output enable signal generation unit suitable for generating a first output enable signal in response to the normal fuse set enable signal and the output control signal, and disabling the first output enable signal when the output control signal is enabled, and a first output unit suitable for generating the first match signal in response to the first output enable signal and the first comparison result signal.

The second fuse set block may include an fuse latch unit suitable for latching the second repair information in response to the latch enable signal transferred from the bank selection block in the first mode, and a second match signal generation unit suitable for comparing third latched addresses outputted from the fuse latch unit and the input addresses, and generating a second match signal in response to a comparison result and the output control signal.

The second match signal generation unit may include a second address comparison unit suitable for comparing the input addresses and the third latched addresses, and generating a second comparison result signal, a second output enable signal generation unit suitable for generating a second output enable signal in response to the output control signal, and a second output unit suitable for generating the second match signal corresponding to the second comparison result signal in response to the second output enable signal.

In an embodiment, a method for operating a semiconductor memory device may include storing a repair information in the SPPR control block and the second fuse set block in a soft post package repair mode, comparing an input address and the repair information stored in the SPPR control block in a normal mode, and disabling driving of the first fuse set block and interrupting a repair operation according to the first fuse set block, and enabling driving of the second fuse set block and performing a repair operation according to the second fuse set block, in the case where it is determined as a result of the comparing that the input address and the repair information stored in the second fuse set block are the same.

The method may further include comparing the input address and a repair information stored in the first fuse set block, in the case where it is determined as a result of the comparing that the input address and the repair information stored in the second fuse set block are not the same; and enabling driving of the first fuse set block and performing the repair operation according to the first fuse set block, in the case where the input address and the repair information stored in the first fuse set block are the same.

In the semiconductor memory device according to the embodiments, since it is possible to prevent an operation error likely to occur when the repair addresses stored in a normal fuse set and a PPR fuse set are the same, the reliability of the semiconductor memory device may be improved.

DETAILED DESCRIPTION

Figure 1:
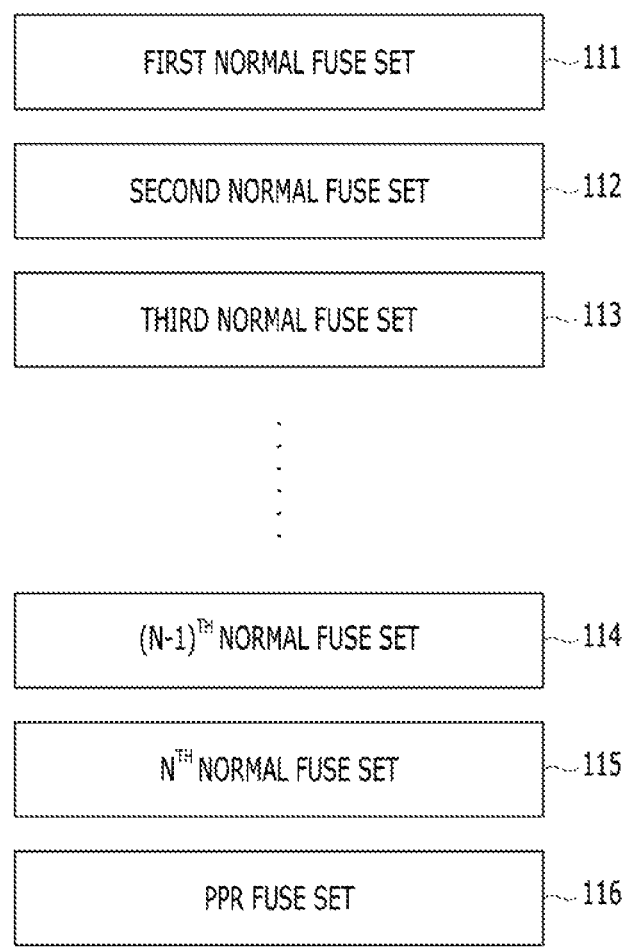
FIG. 1 is a diagram illustrating fuse sets included in a conventional fuse circuit.
Figure 2:
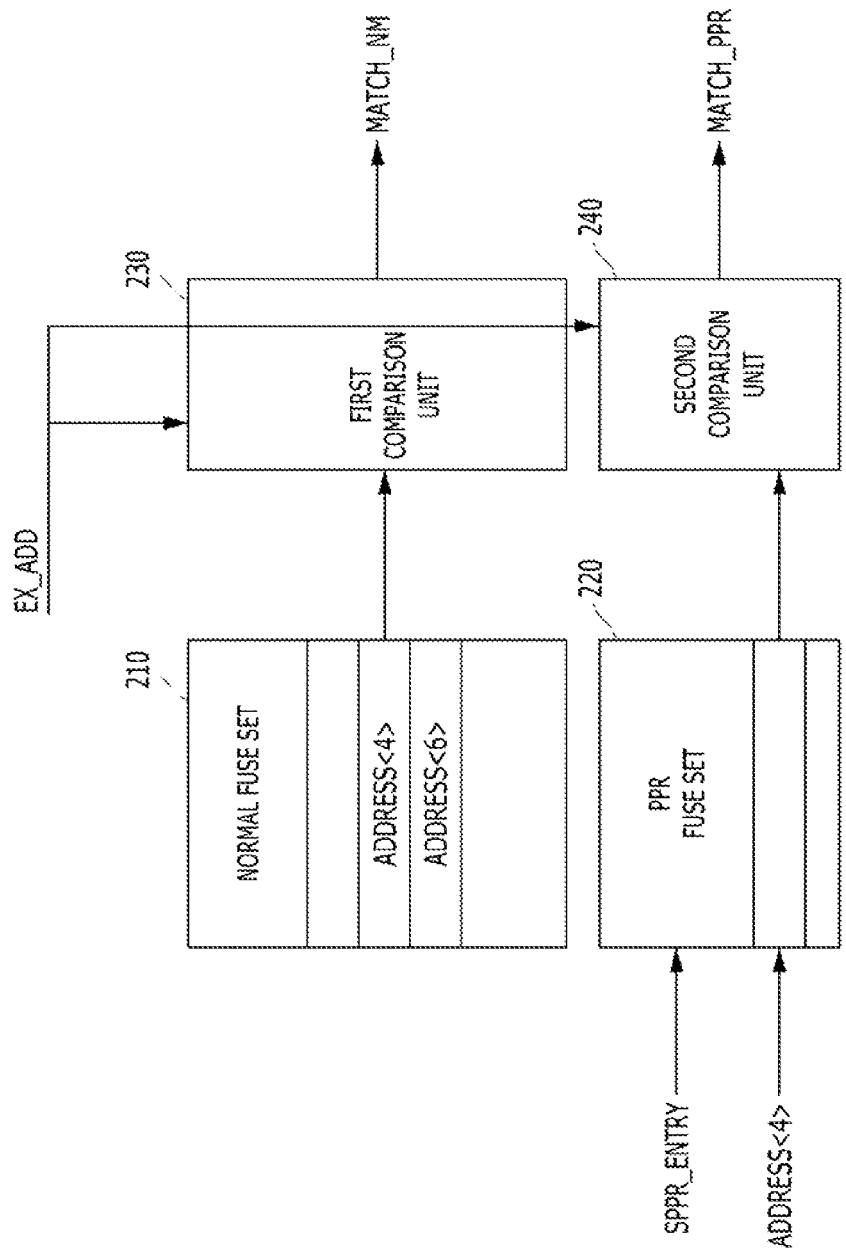
FIG. 2 is a diagram to assist in the explanation of an SPPR operation of a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
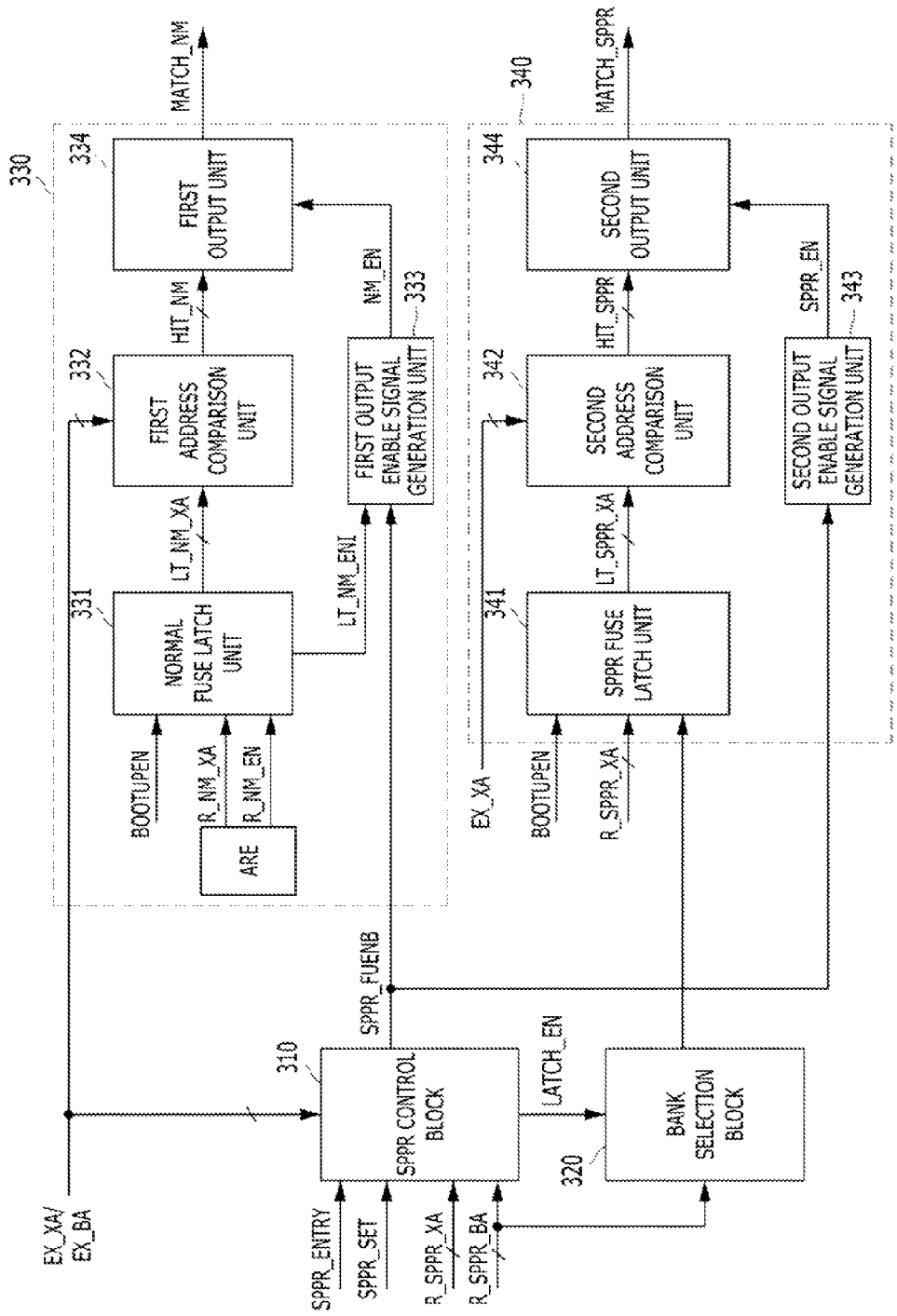
FIG. 3 is a block diagram illustrating a semiconductor memory device in accordance with an embodiment.

FIG. 3 is a block diagram illustrating a semiconductor memory device in accordance with an embodiment.

Referring to FIG. 3, the semiconductor memory device may include an SPPR control block 310, a bank selection block 320, a first fuse set block 330, and a second fuse set block 340.

First, an operation sequence according to an SPPR mode in the semiconductor memory device will be briefly described below.

The semiconductor memory device may enter the SPPR mode by a mode register set (MRS) disposed therein, in response to an SPPR command from an external source. When entering the SPPR mode the semiconductor memory device may enable an SPPR mode signal SPPR_ENTRY. Thereafter, if an active command is applied to the semiconductor memory device, repair addresses R_SPPR_XA and R_SPPR_BA may be applied from the external source.

Then, if a specific memory chip to perform an SPPR operation is selected among a plurality of memory chips in a package state, an SPPR setting signal SPPR_SET may be enabled. If a write command is applied to the semiconductor memory device, the repair addresses R_SPPR_XA and R_SPPR_BA may be stored in the SPPR control block 310 in response to the SPPR setting signal SPPR_SET. Also between the repair addresses R_SPPR_XA and R_SPPR_BA, an SPPR repair row address R_SPPR_XA, as information on a row address, may be stored in the second fuse set block 340.

The semiconductor memory device may exit the SPPR mode by the MRS.

Then, in a normal operation of the semiconductor memory device, input addresses EX_XA and EX_BA may be received from the external source. The SPPR control block 310 of the semiconductor memory device may enable an output control signal SPPR_FUENB when the repair addresses R_SPPR_XA and R_SPPR_BA stored in the SPPR mode and the input addresses EX_XA and EX_BA are the same. The semiconductor memory device may disable the driving of the first fuse set block 330 in response to the enabled output control signal SPPR_FUENB. That is to say, when the output control signal SPPR_FUENB is enabled, the first fuse set block 330 may be interrupted from performing a repair operation even though the input addresses EX_XA and EX_BA correspond to a defective memory cell, that is, the repair addresses stored in the first fuse set block 330 and the input addresses EX_XA and EX_BA are the same. When the repair addresses R_SPPR_XA and R_SPPR_BA stored in the SPPR mode and the input addresses EX_XA and EX_BA are the same, the semiconductor memory device may interrupt the repair operation of the first fuse set block 330 and enable only the repair operation of the second fuse set block 340. Accordingly, it is possible to prevent a read failure that occurs as a redundancy memory cell corresponding to the first fuse set block 330 and a redundancy memory cell corresponding to the second fuse set block 340 are simultaneously accessed.

The SPPR control block 310 may receive the SPPR repair row address R_SPPR_XA and an SPPR repair bank address R_SPPR_BA as information on a bank address between the repair addresses R_SPPR_XA and R_SPPR_BA. The SPPR control block 310 may receive the SPPR mode signal SPPR_ENTRY and the SPPR setting signal SPPR_SET. The SPPR control block 310 may generate a latch enable signal LATCH_EN when both the SPPR mode signal SPPR_ENTRY and the SPPR setting signal SPPR_SET are enabled. The SPPR control block 310 includes a latch unit therein, and the latch unit may latch the SPPR repair row address R_SPPR_XA and the SPPR repair bank address R_SPPR_BA in response to the latch enable signal LATCH_EN. The SPPR control block 310 may receive the input addresses EX_XA and EX_BA, that is, an input row address EX_BA as information on a row address and an input bank address EX_BA as information on a bank address, compare the input row address EX_XA and the input bank address EX_BA with the repair addresses stored in the latch unit, and generate the output control signal SPPR_FUENB. The SPPR control block 310 will be described below in more detail with reference to FIG. 4.

In the normal operation of the semiconductor memory device, the SPPR control block 310 may compare the input row address EX_BA and the input bank address EX_BA applied from the external source with the SPPR repair row address R_SPPR_XA and the SPPR repair bank address R_SPPR_BA latched in the latch unit, respectively, and generate the output control signal SPPR_FUENB which is enabled to a low level, when they correspond as a result of the comparison. The output control signal SPPR_FUENB may be transferred to the first fuse set block 330 and the second fuse set block 340.

The SPPR control block 310 of the semiconductor memory device according to the embodiment may be allocated for each bank group which is constructed by one or more unit banks each including one or more of the first fuse set block 330 and the second fuse set block 340. The output control signal SPPR_FUENB may be a signal which is generated on a basis of a bank group. For example, the output control signal SPPR_FUENB corresponding to the bank group constructed by 4 banks may be applied to 4 first fuse set blocks and 4 second fuse set blocks. Hereafter, in the semiconductor memory device according to the embodiment, the first and second fuse set blocks 330 and 340 included in one bank of a bank group corresponding to the output control signal SPPR_FUENB will be described as an example.

The bank selection block 320 may receive the SPPR repair bank address R_SPPR_BA and the latch enable signal LATCH_EN. The bank selection block 320 may output the latch enable signal LATCH_EN to a bank corresponding to the SPPR repair bank address R_SPPR_BA.

The first fuse set block 330 may include a fuse array ARE, a normal fuse latch unit 331, and a first match signal generation unit. The first match signal generation unit may include a first address comparison unit 332, a first output enable signal generation unit 333, and a first output unit 334.

The normal fuse latch unit 331 may receive a boot-up enable signal BOOTUPEN, a normal repair row address R_NM_XA, and a normal fuse set enable signal R_NM_EN.

The normal repair row address R_NM_XA as an address transferred from the fuse array ARE may be repair address information corresponding to a defective memory cell that occurred at a fabrication stage of the semiconductor memory device. The normal fuse set enable signal R_NM_EN may include information on whether the fuse array ARE is programmed or not. For example, when the fuse array ARE is programmed, the normal fuse set enable signal R_NM_EN may be a high level, and, when the fuse array ARE is not programmed, the normal fuse set enable signal R_NM_EN may be a low level. In other words, the normal fuse set enable signal R_NM_EN with the high level means that repair address information is programmed in the fuse array ARE, and in this case, the normal repair row address R_NM_XA transferred from the fuse array ARE may be a valid address as repair address information. The normal fuse set enable signal R_NM_EN with the low level means that repair address information is not programmed in the fuse array ARE, and in this case, the normal repair row address R_NM_XA transferred from the fuse array ARE may be an invalid address.

The normal fuse latch unit 331 may latch the normal repair row address R_NM_XA and the normal fuse set enable signal R_NM_EN in response to the boot-up enable signal BOOTUPEN. The normal fuse latch unit 331 may latch the normal repair row address R_NM_XA, and output a normal latch address LT_NM_XA. Further, the normal fuse latch unit 331 may latch the normal fuse set enable signal R_NM_EN, and output a normal latch enable signal LT_NM_ENI. Namely, the normal fuse latch unit 331 may store the normal repair row address R_NM_XA as the repair address information programmed in the fuse array ARE at the fabrication stage of the semiconductor memory device and the normal fuse set enable signal R_NM_EN as the information on whether the fuse array ARE is programmed or not, in response to the boot-up enable signal BOOTUPEN.

The first address comparison unit 332 may receive and compare the input row address EX_XA and the normal latch address LT_NM_XA. The first address comparison unit 332 may compare the input row address EX_XA and the normal latch address LT_NM_XA, and output a first comparison result signal HIT_NM corresponding to a comparison result. The first address comparison unit 332 may compare the input row address EX_XA and the normal latch address LT_NM_XA, and generate the first comparison result signal HIT_NM which is enabled to a high level, when they correspond.

The first output enable signal generation unit 333 may receive the output control signal SPPR_FUENB and the normal latch enable signal LT_NM_ENI which is outputted from the normal fuse latch unit 331. The first output enable signal generation unit 333 may generate a first output enable signal NM_EN in response to the normal latch enable signal LT_NM_ENI and the output control signal SPPR_FUENB.

The first output enable signal generation unit 333 may generate the first output enable signal NM_EN which is disabled to a low level, regardless of the normal latch enable signal LT_NM_ENI, in response to the output control signal SPPR_FUENB which is enabled to the low level. The first output enable signal generation unit 333 may generate the first output enable signal NM_EN which is a high level or the low level based on the normal latch enable signal LT_NM_ENI, in response to the output control signal SPPR_FUENB which is disabled to a high level.

For example, when the input row address EX_XA and the input bank address EX_BA are the same as the SPPR repair row address R_SPPR_XA and the SPPR repair bank address R_SPPR_BA latched in the SPPR control block 310, in response to the output control signal SPPR_FUENB which has the low level, the first output enable signal generation unit 333 may disable the first output enable signal NM_EN to the low level, regardless of whether the normal latch enable signal LT_NM_ENI is enabled or not.

Conversely, when the input row address EX_XA and the input bank address EX_BA are not the same as the SPPR repair row address R_SPPR_XA and the SPPR repair bank address R_SPPR_BA latched in the SPPR control block 310, in response to the output control signal SPPR_FUENB which has the high level, the first output enable signal generation unit 333 may enable the first output enable signal NM_EN to the high level when the normal latch enable signal LT_NM_ENI is enabled, that is, the fuse array ARE is programmed, and may disable the first output enable signal NM_EN to the low level when the normal latch enable signal LT_NM_ENI is disabled, that is, the fuse array ARE is not programmed.

The first output unit 334 may receive the first comparison result signal HIT_NM and the first output enable signal NM_EN. The first output unit 334 may generate a first match signal MATCH_NM in response to the first output enable signal NM_EN and the first comparison result signal HIT_NM. While not shown, the redundancy memory cell corresponding to the first fuse set block 330 may be accessed in response to the first match signal MATCH_NM.

The first output unit 334 may generate the first match signal MATCH_NM with a low level, regardless of the first comparison result signal HIT_NM in response to the first output enable signal NM_EN of the low level.

The first output unit 334 may generate the first match signal MATCH_NM based on the first comparison result signal HIT_NM in response to the first output enable signal NM_EN of the high level. That is to say, when the input row address EX_XA and the normal latch address LT_NM_XA are the same, the first comparison result signal HIT_NM is enabled to the high level, and the first output unit 334 may generate the first match signal MATCH_NM with a high level in response to the first output enable signal NM_EN of the high level and the first comparison result signal HIT_N of the high level. Conversely, when the input row address EX_XA and the normal latch address LT_NM_XA are not the same, the first comparison result signal HIT_NM is disabled to a low level, and the first output unit 334 may generate the first match signal MATCH_NM with the low level in response to the first output enable signal NM_EN of the high level and the first comparison result signal HIT_NM of the low level.

In detail, when the input row address EX_XA and the input bank address EX_BA are the same as the SPPR repair row address R_SPPR_XA and the SPPR repair bank address R_SPPR_BA latched in the SPPR control block 310, the output control signal SPPR_FUENB is enabled to the low level. In response to the output control signal SPPR_FUENB of the low level, the first output enable signal NM_EN may be disabled to the low level regardless of whether the normal fuse set enable signal R_NM_EN is enabled or not. The first output unit 334 may generate the first match signal MATCH_NM disabled to the low level, regardless of a result of comparing the input row address EX_XA and the normal repair row address R_NM_XA, in response to the first output enable signal NM_EN of the low level.

Conversely, when the input row address EX_XA and the input bank address EX_BA are not the same as the SPPR repair row address R_SPPR_XA and the SPPR repair bank address R_SPPR_BA latched in the SPPR control block 310, the output control signal SPPR_FUENB is disabled to the high level. When the repair address information is programmed in the fuse array ARE, the normal fuse set enable signal R_NM_EN is enabled to the high level and the first output enable signal NM_EN may be enabled to the high level. In response to the first output enable signal NM_EN of the high level, the first output unit 334 may generate the first match signal MATCH_NM with the high level based on the first comparison result signal HIT_NM of the high level when the input row address EX_XA and the normal repair row address R_NM_XA are the same, and may generate the first match signal MATCH_NM with the low level based on the first comparison result signal HIT_NM of the low level when the input row address EX_XA and the normal repair row address R_NM_XA are not the same.

Moreover, when the input row address EX_XA and the input bank address EX_BA are not the same as the SPPR repair row address R_SPPR_XA and the SPPR repair bank address R_SPPR_BA latched in the SPPR control block 310, the output control signal SPPR_FUENB is disabled to the high level. When the repair address information is not programmed in the fuse array ARE, the normal fuse set enable signal R_NM_EN is disabled to the low level and the first output enable signal NM_EN may be disabled to the low level. The first output unit 334 may generate the first match signal MATCH_NM disabled to the low level, regardless of a result of comparing the input row address EX_XA and the normal repair row address R_NM_XA, in response to the first output enable signal NM_EN of the low level.

In summary, when the input row address EX_XA and the input bank address EX_BA are the same as the SPPR repair row address R_SPPR_XA and the SPPR repair bank address R_SPPR_BA latched in the SPPR control block 310, the output control signal SPPR_FUENB is enabled to the low level. At this time, the first output unit 334 generates the first match signal MATCH_NM with the low level, even though the input row address EX_XA corresponds to a defective memory cell, that is, the input row address EX_XA and the repair address information stored in the normal fuse latch unit 331 correspond. The redundancy memory cell corresponding to the first fuse set block 330 may be disabled.

Further, when the input row address EX_XA and the input bank address EX_BA are not the same as the SPPR repair row address R_SPPR_XA and the SPPR repair bank address R_SPPR_BA latched in the SPPR control block 310, the output control signal SPPR_FUENB is disabled to the high level. At this time, the first output unit 334 generates the first match signal MATCH_NM with the low level, when the input row address EX_XA corresponds to a normal memory cell, that is, the input row address EX_XA and the repair address Information stored in the normal fuse latch unit 331 do not correspond. The normal memory cell may be accessed. Also, when the output control signal SPPR_FUENB is disabled to the high level, the first output unit 334 generates the first match signal MATCH_NM with the high level, when the input row address EX_XA corresponds to a defective memory cell, that is, the input row address EX_XA and the repair address information stored in the normal fuse latch unit 331 correspond. The redundancy memory cell corresponding to the first fuse set block 330 may be accessed.

The second fuse set block 340 may include an SPPR fuse latch unit 341, and a second match signal generation unit. The second match signal generation unit may include a second address comparison unit 342, a second output enable signal generation unit 343, and a second output unit 344.

The SPPR fuse latch unit 341 may receive the boot-up enable signal BOOTUPEN, the latch enable signal LATCH_EN, and the SPPR repair row address R_SPPR_XA. The SPPR repair row address R_SPPR_XA may be address information corresponding to a defective memory cell that occurred at a packaging stage of the semiconductor memory device. In the SPPR mode, the SPPR repair row address R_SPPR_XA may not be the repair address information transferred from the fuse array ARE but the repair address information directly applied from the external source.

The second fuse set block 340 may be a fuse set block allocated to a PPR mode, and the PPR mode may be divided into a hard PPR (HPPR) mode and the soft PPR (SPPR) mode.

The SPPR fuse latch unit 341 may latch the SPPR repair row address R_SPPR_XA in response to the boot-up enable signal BOOTUPEN in the HPPR mode. The SPPR fuse latch unit 341 may latch the SPPR repair row address R_SPPR_XA in response to the latch enable signal LATCH_EN outputted from the bank selection block 320, in the SPPR mode.

The SPPR fuse latch unit 341 may latch the SPPR repair row address R_SPPR_XA and output an SPPR latch address LT_SPPR_XA, In other words, the SPPR fuse latch unit 341 may store the SPPR repair row address R_SPPR_XA applied from the external source, in response to the latch enable signal LATCH_EN.

The second address comparison unit 342 may receive and compare the input row address EX_XA and the SPPR latch address LT_SPPR_XA. The second address comparison unit 342 may compare the input row address EX_XA and the SPPR latch address LT_SPPR_XA, and output a second comparison result signal HIT_SPPR corresponding to a comparison result.

For example, when the input row address EX_XA and the SPPR latch address LT_SPPR_XA are the same, the second comparison result signal HIT_SPPR may be enabled to a high level. Conversely, when the input row address EX_XA and the SPPR latch address LT_SPPR_XA are not the same, the second comparison result signal HIT_SPPR may be disabled to a low level.

The second output enable signal generation unit 343 may receive the output control signal SPPR_FUENB. The second output enable signal generation unit 343 may generate a second output enable signal SPPR_EN in response to the output control signal SPPR_FUENB.

For example, the second output enable signal generation unit 343 may generate the second output enable signal SPPR_EN which is enabled to a high level, in response to the output control signal SPPR_FUENB which is enabled to the low level.

Conversely, the second output enable signal generation unit 343 may generate the second output enable signal SPPR_EN which is disabled to a low level, in response to the output control signal SPPR_FUENB which is disabled to the high level.

The second output unit 344 may receive the second comparison result signal HIT_SPPR and the second output enable signal SPPR_EN. The second output unit 344 may generate a second match signal MATCH_SPPR in response to the second output enable signal SPPR_EN and the second comparison result signal HIT_SPPR. While not shown, the redundancy memory cell corresponding to the second fuse set block 340 may be accessed in response to the second match signal MATCH_SPPR.

The second output unit 344 may generate the second match signal MATCH_SPPR with a low level, regardless of the second comparison result signal HIT_SPPR, in response to the second output enable signal SPPR_EN of the low level.

The second output unit 344 may generate the second match signal MATCH_SPPR based on the second comparison result signal HIT_SPPR, in response to the second output enable signal SPPR_EN of the high level, That is to say, when the input row address EX_XA and the SPPR latch address LT_SPPR_XA are the same, the second comparison result signal HIT_SPPR may be enabled to the high level. The second output unit 344 may generate the second match signal MATCH_SPPR with a high level in response to the second output enable signal SPPR_EN of the high level and the second comparison result signal HIT_SPPR of the high level. Conversely, when the input row address EX_XA and the SPPR latch address LT_SPPR_XA are not the same, the second comparison result signal HIT_SPPR may be disabled to the low level. The second output unit 344 may generate the second match signal MATCH_SPPR with the low level in response to the second output enable signal SPPR_EN of the high level and the second comparison result signal HIT_SPPR of the low level.

In detail, when the input row address EX_XA and the input bank address EX_BA are the same as the SPPR repair row address R_SPPR_XA and the SPPR repair bank address R_SPPR_BA latched in the SPPR control block 310, the output control signal SPPR_FUENB is enabled to the low level. In response to the output control signal SPPR_FUENB of the low level, the second output enable signal SPPR_EN may be enabled to the high level. In response to the second output enable signal SPPR_EN of the high level, the second output unit 344 may generate the second match signal MATCH_SPPR with the high level based on the second comparison result signal HIT_SPPR enabled to the high level because the input row address EX_XA and the SPPR repair row address R_SPPR_XA latched in the SPPR fuse latch unit 341 are the same.

Conversely, when the input row address EX_XA and the input bank address EX_BA are not the same as the SPPR repair row address R_SPPR_XA and the SPPR repair bank address R_SPPR_BA latched in the SPPR control block 310, the output control signal SPPR_FUENB is disabled to the high level. In response to the output control signal SPPR_FUENB of the high level, the second output enable signal SPPR_EN may be disabled to the low level. The second output unit 344 may generate the second match signal MATCH_SPPR with the low level, regardless of a result of comparing the input row address EX_XA and the SPPR repair row address R_SPPR_XA, in response to the second output enable signal SPPR_EN of the low level.

In summary, when the input row address EX_XA and the input bank address EX_BA are the same as the SPPR repair row address R_SPPR_XA and the SPPR repair bank address R_SPPR_BA latched in the SPPR control block 310, the output control signal SPPR_FUENB is enabled to the low level. The second output unit 344 of the second fuse set block 340 corresponding to the SPPR repair bank address R_SPPR_BA may generate the second match signal MATCH_SPPR with the high level, and the redundancy memory cell corresponding to the second fuse set block 340 may be accessed.

Further, when the input row address EX_XA and the input bank address EX_BA are not the same as the SPPR repair row address R_SPPR_XA and the SPPR repair bank address R_SPPR_BA latched in the SPPR control block 310, the output control signal SPPR_FUENB is disabled to the high level. The second output unit 344 of the second fuse set block 340 corresponding to the SPPR repair bank address R_SPPR_BA may generate the second match signal MATCH_SPPR with the low level and thus the redundancy memory cell corresponding to the second fuse set block 340 may not be accessed. When the input row address EX_XA corresponds to a normal memory cell, that is, the input row address EX_XA and the repair address information stored in the normal fuse latch unit 331 do not correspond, the first output unit 334 may generate the first match signal MATCH_NM with the low level and thus the normal memory cell may be accessed. Also, when the output control signal SPPR_FUENB is disabled to the high level, the first output unit 334 may generate the first match signal MATCH_NM with the high level, when the input row address EX_XA corresponds to a defective memory cell, that is, the input row address EX_XA and the repair address information stored in the normal fuse latch unit 331 correspond. The redundancy memory cell corresponding to the first fuse set block 330 may be accessed.

Next, operations of the semiconductor memory device will be described below.

The normal fuse latch unit 331 may receive and latch the normal repair row address R_NM_XA and the normal fuse set enable signal R_NM_EN in response to the boot-up enable signal BOOTUPEN. The normal fuse latch unit 331 may output the normal latch address LT_NM_XA to the first address comparison unit 332. The normal fuse latch unit 331 may output the normal latch enable signal LT_NM_ENI to the first output enable signal generation unit 333.

Thereafter, when the semiconductor memory device enters the SPPR mode, the SPPR mode signal SPPR_ENTRY may be enabled. If the active command is applied, the SPPR repair row address R_SPPR_XA may be applied to the SPPR control block 310 and the SPPR fuse latch unit 341, and the SPPR repair bank address R_SPPR_BA may be applied to the SPPR control block 310 and the bank selection block 320.

If the write command is applied, the SPPR control block 310 may receive the SPPR setting signal SPPR_SET with a high level. The SPPR control block 310 may generate the latch enable signal LATCH_EN in response to the SPPR mode signal SPPR_ENTRY and the SPPR setting signal SPPR_SET. The latch unit of the SPPR control block 310 may latch the SPPR repair row address R_SPPR_XA and the SPPR repair bank address R_SPPR_BA in response to the latch enable signal LATCH_EN. The SPPR control block 310 may output the latch enable signal LATCH_EN to the bank selection block 320.

The bank selection block 320 may transfer the latch enable signal LATCH_EN to a bank corresponding to the SPPR repair bank address R_SPPR_BA. The SPPR fuse latch unit 341 of the bank corresponding to the SPPR repair bank address R_SPPR_BA may store the SPPR repair row address R_SPPR_XA in response to the latch enable signal LATCH_EN.

Then, the semiconductor memory device may exit the SPPR mode.

In the normal operation of the semiconductor memory device, the input row address EX_XA and the input bank address EX_BA may be received from the external source. The input row address EX_XA and the input bank address EX_BA may be applied to the SPPR control block 310. Further, the input row address EX_XA may be applied to the first and second address comparison units 332 and 342.

The SPPR control block 310 may compare the SPPR repair row address R_SPPR_XA and the SPPR repair bank address R_SPPR_BA stored in the latch unit with the input row address EX_XA and the input bank address EX_BA, and may generate the output control signal SPPR_FUENB enabled to the low level when they are the same.

For example, descriptions will be made below for when the SPPR repair row address R_SPPR_XA and the SPPR repair bank address R_SPPR_BA stored in the latch unit of the SPPR control block 310 are the same as the input row address EX_XA and the input bank address EX_BA.

The SPPR control block 310 may generate the output control signal SPPR_FUENB enabled to the low level. The output control signal SPPR_FUENB may be transferred to the first and second output enable signal generation units 333 and 343.

The first address comparison unit 332 may compare the normal latch address LT_NM_XA outputted from the normal fuse latch unit 331 and the input row address EX_XA, and output the first comparison result signal HIT_NM as a comparison result to the first output unit 334.

The first output enable signal generation unit 333 which receives the output control signal SPPR_FUENB enabled to the low level may generate the first output enable signal NM_EN which is disabled to the low level, regardless of the normal latch enable signal LT_NM_ENI. The first output unit 334 may generate the first match signal MATCH_NM disabled to the low level, regardless of the first comparison result signal HIT_NM, in response to the first output enable signal NM_EN of the low level.

The second address comparison unit 342 may compare the SPPR latch address LT_SPPR_XA outputted from the SPPR fuse latch unit 341 and the input row address EX_XA. The second address comparison unit 342 may output the second comparison result signal HIT_SPPR enabled to the high level, to the second output unit 344, because the SPPR latch address LT_SPPR_XA and the input row address EX_XA are the same.

The second output enable signal generation unit 343 which receives the output control signal SPPR_FUENB enabled to the low level may generate the second output enable signal SPPR_EN which is enabled to the high level. The second output unit 344 may generate the second match signal MATCH_SPPR with the high level in response to the second output enable signal SPPR_EN of the high level.

Accordingly, a repair operation may be performed in such a manner that the redundancy memory cell corresponding to the first fuse set block 330 is not accessed in response to the first match signal MATCH_NM of the low level and the redundancy memory cell corresponding to the second fuse set block 340 is accessed in response to the second match signal MATCH_SPPR of the high level.

Next, descriptions will be made below for when the SPPR repair row address R_SPPR_XA and the SPPR repair bank address R_SPPR_BA stored in the latch unit of the SPPR control block 310 are not the same as the input row address EX_XA and the input bank address EX_BA.

The SPPR control block 310 may generate the output control signal SPPR_FUENB disabled to the high level. The output control signal SPPR_FUENB may be transferred to the first and second output enable signal generation units 333 and 343.

The first address comparison unit 332 may compare the normal latch address LT_NM_XA outputted from the normal fuse latch unit 331 and the input row address EX_XA, and output the first comparison result signal HIT_NM as a comparison result to the first output unit 334.

The first output enable signal generation unit 333 which receives the output control signal SPPR_FUENB disabled to the high level may generate the first output enable signal NM_EN which has the high level or the low level based on the normal latch enable signal LT_NM_ENI. For example, if the repair address information is programmed in the fuse array ARE, the normal fuse set enable signal R_NM_EN is enabled to the high level, and the normal latch enable signal LT_NM_ENI may have a high level as well. The first output enable signal generation unit 333 may generate the first output enable signal NM_EN of the high level in response to the normal latch enable signal LT_NM_ENI of the high level. When the input row address EX_XA and the normal latch address LT_NM_XA stored in the normal fuse latch unit 331 are the same, the first address comparison unit 332 may generate the first comparison result signal HIT_NM of the high level, and the first output unit 334 may generate the first match signal MATCH_NM enabled to the high level in response to the first output enable signal NM_EN of the high level and the first comparison result signal HIT_NM of the high level.

The second address comparison unit 342 may compare the SPPR latch address LT_SPPR_XA outputted from the SPPR fuse latch unit 341 and the input row address EX_XA. The second address comparison unit 342 may output the second comparison result signal HIT_SPPR disabled to the low level, to the second output unit 344, because the SPPR latch address LT_SPPR_XA and the input row address EX_XA are not the same.

The second output enable signal generation unit 343 which receives the output control signal SPPR_FUENB disabled to the high level may generate the second output enable signal SPPR_EN of the low level. The second output unit 344 may generate the second match signal MATCH_SPPR of the low level in response to the second output enable signal SPPR_EN of the low level.

Accordingly, a repair operation may be performed in such a manner that the redundancy memory cell corresponding to the first fuse set block 330 is accessed in response to the first match signal MATCH_NM of the high level, and the redundancy memory cell corresponding to the second fuse set block 340 may be disabled in response to the second match signal MATCH_SPPR of the low level.

Therefore, the semiconductor memory device in accordance with the embodiment may latch the SPPR repair addresses R_SPPR_XA and R_SPPR_in the SPPR control block 310 in the SPPR mode. Thereafter, in the normal operation, when the latched SPPR repair addresses R_SPPR_XA and R_SPPR_BA are the same as the input addresses EX_XA and EX_BA the first output enable signal NM_EN of the first fuse set block 330 may be disabled using the output control signal SPPR_FUENB. That is, the repair operation of the first fuse set block 330 may be interrupted.

The semiconductor memory device may prevent a malfunction that is likely to occur due to the fact that a plurality of redundancy memory cells are driven in a normal operation of the semiconductor memory device when the same repair address information is set at the wafer and package levels. Therefore, the reliability of the semiconductor memory device may increase.

Figure 4:
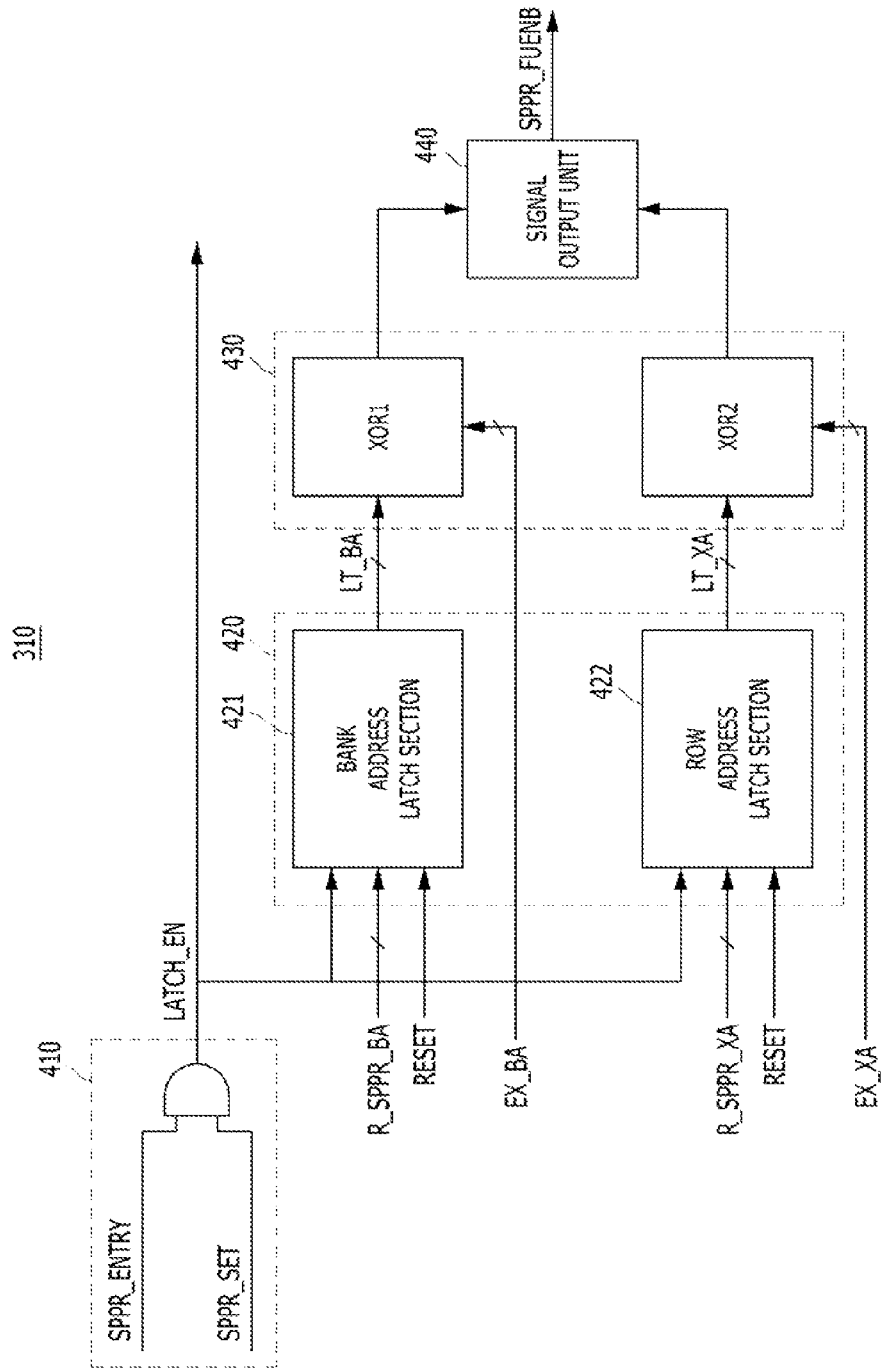
FIG. 4 is a block diagram illustrating an SPPR control block shown in FIG. 3.

FIG. 4 is a block diagram illustrating the SPPR control block 310 shown in FIG. 3.

Referring to FIG. 4, the SPPR control block 310 may include a latch enable signal generation unit 410, an address latch unit 420, a comparison unit 430, and a signal output unit 440.

The latch enable signal generation unit 410 may include an AND gate which receives the SPPR mode signal SPPR_ENTRY and the SPPR setting signal SPPR_SET. The latch enable signal generation unit 410 may generate the latch enable signal LATCH_EN with a high level in response to the SPPR mode signal SPPR_ENTRY and the SPPR setting signal SPPR_SET both enabled to high levels. The latch enable signal LATCH_EN may be outputted to the address latch unit 420 and the bank selection block 320.

The address latch unit 420 may include a bank address latch section 421 and a row address latch section 422.

The bank address latch section 421 may receive the SPPR repair bank address R_SPPR_BA as information on a bank address between the repair addresses R_SPPR_XA and R_SPPR_BA, the latch enable signal LATCH_EN, and an initialization signal RESET. The bank address latch section 421 may store the SPPR repair bank address R_SPPR_BA in response to the latch enable signal LATCH_EN, The bank address latch section 421 may initialize a stored bank address in response to the initialization signal RESET.

The row address latch section 422 may receive the SPPR repair row address R_SPPR_XA as information on a row address between the repair addresses R_SPPR_XA and R_SPPR_BA, the latch enable signal LATCH_EN, and the initialization signal RESET. The row address latch section 422 may store the SPPR repair row address R_SPPR_XA in response to the latch enable signal LATCH_EN. The row address latch section 422 may initialize a stored row address in response to the initialization signal RESET.

The comparison unit 430 may include first and second XOR gates XOR1 and XOR2. The first XOR gate XOR1 may compare the input bank address EX_BA and a latched bank address LT_BA outputted from the bank address latch section 421. Also, the second XOR gate XOR2 may compare the input row address EX_XA and a latched row address LT_XA outputted from the row address latch section 422.

The signal output unit 440 may generate the output control signal SPPR_FUENB based on the comparison results outputted from the comparison unit 430. The signal output unit 440 may generate the output control signal SPPR_FUENB with the low level when two signals both with high levels are received from the comparison unit 430. In other words, the signal output unit 440 may generate the output control signal SPPR_FUENB enabled to the low level when the latched bank address LT_BA latched by the bank address latch section 421 and the input bank address EX_BA are the same and the latched row address LT_XA latched by the row address latch section 422 and the input row address EX_XA are the same.

The SPPR control block 310 in accordance with the embodiment may store the SPPR repair bank address R_SPPR_BA and the SPPR repair row address R_SPPR_XA applied in the SPPR mode, and may generate the output control signal SPPR_FUENB when the input bank address EX_BA and the input row address EX_XA applied in the normal operation are the same as the stored SPPR repair bank address R_SPPR_BA and the stored SPPR repair row address R_SPPR_XA.

Figure 5:
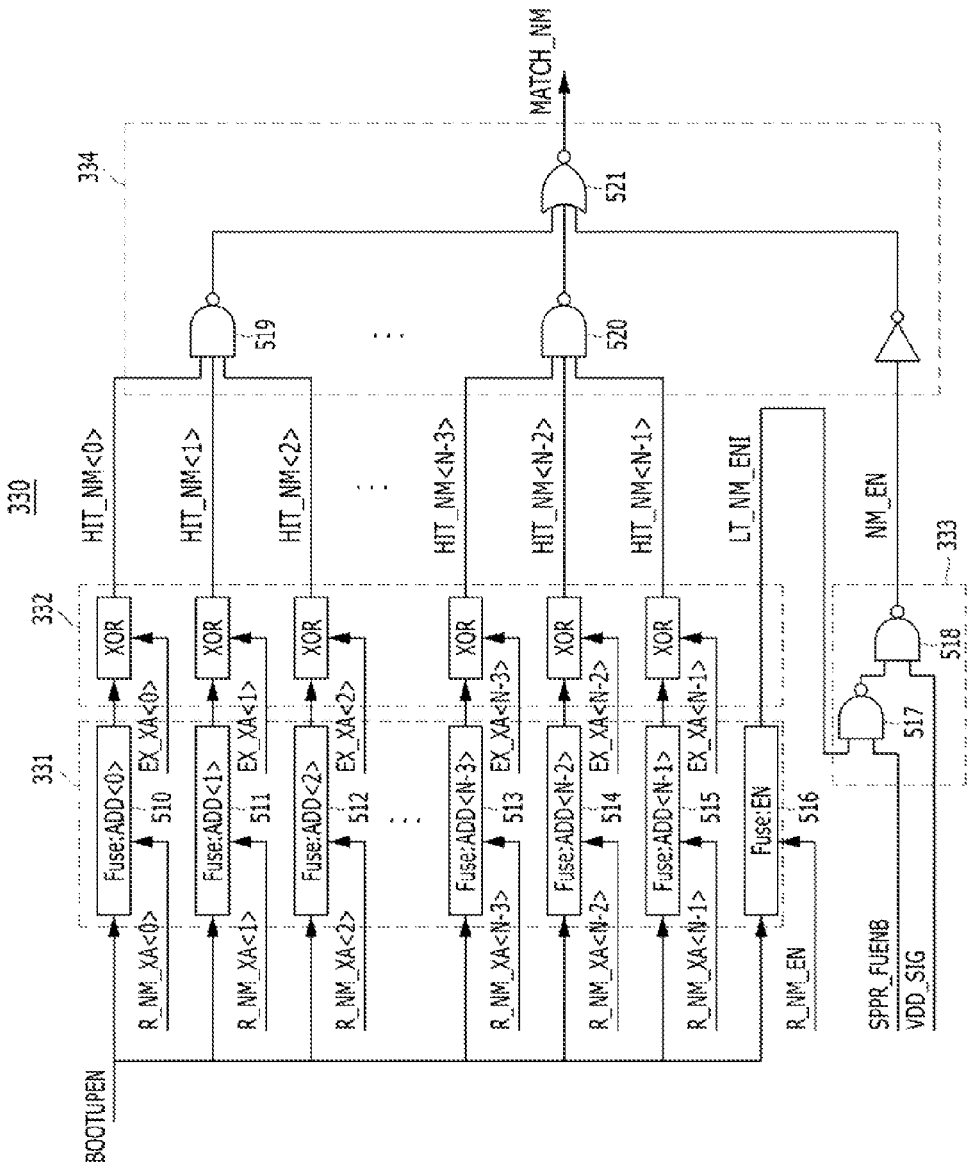
FIG. 5 is a detailed circuit diagram illustrating a first fuse set block shown in FIG. 3.

FIG. 5 is a detailed circuit diagram illustrating the first fuse set block 330 shown in FIG. 3.

Referring to FIG. 5, the first fuse set block 330 may include the normal fuse latch unit 331, the first address comparison unit 332, the first output enable signal generation unit 333, and the first output unit 334.

The normal fuse latch unit 331 may receive the boot-up enable signal BOOTUPEN and N-bit normal repair row addresses R_NM_XA<0:N−1>. The normal fuse latch unit 331 may include N number of first latch sections 510 to 515 for latching the normal repair row addresses R_NM_XA<0:N−1> and a second latch section 516 for latching the normal fuse set enable signal R_NM_EN. As described above with reference to FIG. 3, the normal repair row addresses R_NM_XA<0:N−1> as repair addresses corresponding to a defective memory cell that occurred at a fabrication stage of the semiconductor memory device may be information permanently programmed in the fuse array ARE. The normal fuse set enable signal R_NM_EN may be information on whether the fuse array ARE is programmed or not.

The first latch sections 510 to 515 of the normal fuse latch unit 331 may store the normal repair row addresses R_NM_XA<0:N−1> with N bits in response to the boot-up enable signal BOOTUPEN, and output the stored normal repair row addresses R_NM_XA<0:N−1> as normal latch addresses LT_NM_XA<0:N−1> to the first address comparison unit 332. The second latch section 516 of the normal fuse latch unit 331 may store the normal fuse set enable signal R_NM_EN in response to the boot-up enable signal BOOTUPEN, and output the stored normal fuse set enable signal R_NM_EN as the normal latch enable signal LT_NM_ENI to the first output enable signal generation unit 333.

The first address comparison unit 332 may include XOR gates XOR for respectively comparing the normal latch addresses LT_NM_XA<0:N−1> of N bits outputted from the first latch sections 510 to 515 and input row addresses EX_XA<0:N−1>. The first address comparison unit 332 may respectively compare the normal latch addresses LT_NM_XA<0:N−1> and the input row addresses EX_XA<0:N−1>, and output N number of first comparison result signals HIT_NM<0:N−1>.

The first output enable signal generation unit 333 may include a first NAND gate 517 which receives the normal latch enable signal LT_NM_ENI and the output control signal SPPR_FUENB, and a second NAND gate 518 which receives the output signal of the first NAND gate 517 and a signal VDD_SIG of a power supply voltage level.

For example, when the output control signal SPPR_FUENB is enabled to the low level, the first NAND gate 517 may output its output signal at a high level regardless of the normal latch enable signal LT_NM_ENI. The second NAND gate 518 may output the first output enable signal NM_EN with the low level in response to the output signal of the first NAND gate 517 and the signal VDD_SIG of the power supply voltage level.

Conversely, when the output control signal SPPR_FUENB is disabled to the high level, the first NAND gate 517 may determine the level of its output signal, based on the normal latch enable signal LT_NM_ENI. The second NAND gate 518 may output the first output enable signal NM_EN with the high level or the low level based on the output signal of the first NAND gate 517.

The first output unit 334 may include a group of NAND gates 519 and 520 which respectively receive the N number of first comparison result signals HIT_NM<0:N−1> outputted from the first address comparison unit 332, and a NOR gate 521 which receives the signals outputted from the group of NAND gates 519 and 520 and the inverted signal of the first output enable signal NM_EN and outputs the first match signal MATCH_NM.

For example, when the first output enable signal NM_EN is the low level, the NOR gate 521 may be applied with an input signal of a high level, and output the first match signal MATCH_NM with the low level regardless of the signals outputted from the group of NAND gates 519 and 520, that is, the first comparison result signals HIT_NM<0:N−1>.

Conversely, when the first output enable signal NM_EN is the high level, the NOR gate 521 may be applied with an input signal of a low level, and output the first match signal MATCH_NM with the high level or the low level based on the signals outputted from the group of NAND gates 519 and 520, that is, the first comparison result signals HIT_NM<0:N−1>.

Figure 6:
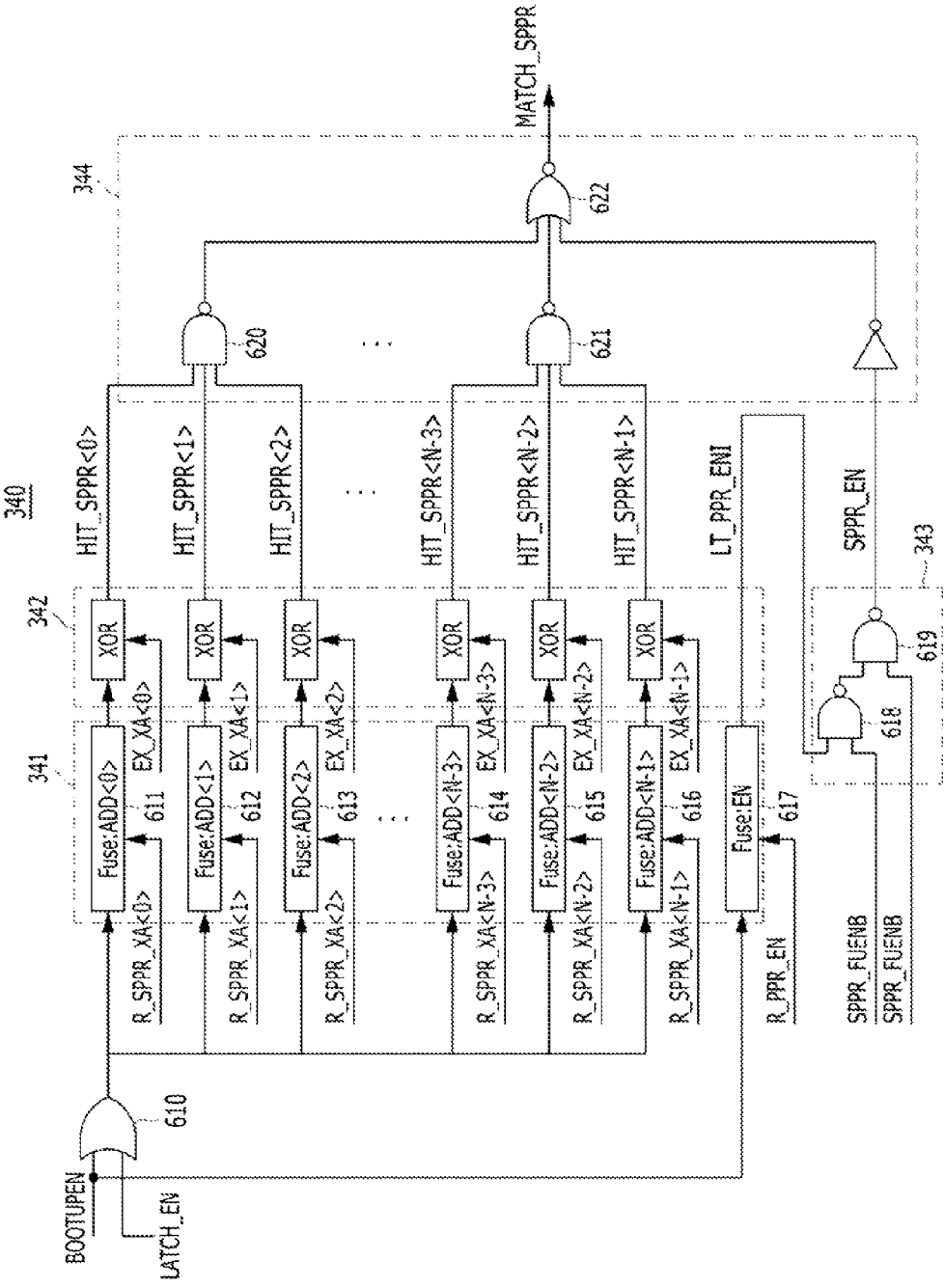
FIG. 6 is a detailed circuit diagram illustrating a second fuse set block shown in FIG. 3.

FIG. 6 is a detailed circuit diagram illustrating the second fuse set block 340 shown in FIG. 3.

Referring to FIG. 6, the second fuse set block 340 may include the SPPR fuse latch unit 341, the second address comparison unit 342, the second output enable signal generation unit 343, and the second output unit 344. The second fuse set block 340 may further include a NOR gate 610 which receives the boot-up enable signal BOOTUPEN and the latch enable signal LATCH_EN.

The NOR gate 610 may output its output signal at a high level when even one of the boot-up enable signal BOOTUPEN and the latch enable signal LATCH_EN is enabled. The output signal of the NOR gate 610 may be transferred to the SPPR fuse latch unit 341. As described above with reference to FIG. 3, in the HPPR mode of the PPR mode, the boot-up enable signal BOOTUPEN may be enabled to a high level, and in the SPPR mode of the PPR mode, the boot-up enable signal BOOTUPEN may be disabled and the latch enable signal LATCH_EN may be enabled to the high level.

The SPPR fuse latch unit 341 may receive the output signal of the NOR gate 610 and an N-bit SPPR repair row address R_SPPR_XA<0:N−1>. The SPPR fuse latch unit 341 may include N number of first latch sections 611 to 616 for latching the SPPR repair row addresses R_SPPR_XA<0:N−1>, and a second latch section 617 for latching a PPR fuse set enable signal R_PPR_EN.

The N number of first latch sections 611 to 616 may store the SPPR repair row addresses R_SPPR_XA<0:N−1> with N bits in response to the output signal of the NOR gate 610, and output the stored SPPR repair row addresses R_SPPR_XA<0:N−1> as SPPR latch addresses LT_SPPR_XA<0:N−1> to the second address comparison unit 342.

The second latch section 617 may store the PPR fuse set enable signal R_PPR_EN in response to the boot-up enable signal BOOTUPEN. However, in the SPPR mode, since the boot-up enable signal BOOTUPEN is disabled, the second latch section 617 may output a PPR latch enable signal LT_PPR_ENI with a low level to the second output enable signal generation unit 343.

The second address comparison unit 342 may include XOR gates XOR for respectively comparing the SPPR latch addresses LT_SPPR_XA<0:N−1> of N bits outputted from the N number of first latch sections 611 to 616 and the input row addresses EX_XA<0:N−1>. The second address comparison unit 342 may respectively compare the SPPR latch addresses LT_SPPR_XA<0:N−1> and the input row addresses EX_XA<0:N−1>, and output N number of second comparison result signals HIT_SPPR<0:N−1>.

The second output enable signal generation unit 343 may include a first NAND gate 618 which receives the PPR latch enable signal LT_PPR_ENI of the low level and the output control signal SPPR_FUENB, and a second NAND gate 619 which receives the output signal of the first NAND gate 618 and the output control signal SPPR_FUENB.

For example, when the output control signal SPPR_FUENB is enabled to the low level, the first NAND gate 618 may output its output signal at a high level. The second NAND gate 619 may output the second output enable signal SPPR_EN with the high level in response to the output control signal SPPR_FUENB with the low level and the output signal of the first NAND gate 618.

Conversely, when the output control signal SPPR_FUENB is disabled to the high level, the first NAND gate 618 may output its output signal at a high level in response to the PPR latch enable signal LT_PPR_ENI of the low level. The second NAND gate 619 may output the second output enable signal SPPR_EN with the low level in response to the output signal of the first NAND gate 618 and the output control signal SPPR_FUENB with the high level.

The second output unit 344 may include a group of NAND gates 620 and 621 which respectively receive the N number of second comparison result signals HIT_SPPR<0:N−1> outputted from the second address comparison unit 342, and a NOR gate 622 which receives the signals outputted from the group of NAND gates 620 and 621 and the inverted signal of the second output enable signal SPPR_EN and outputs the second match signal MATCH_SPPR.

For example, when the second output enable signal SPPR_EN is the high level, the NOR gate 622 may be applied with an input signal of a low level, and output the second match signal MATCH_SPPR with the high level or the low level based on the signals outputted from the group of NAND gates 620 and 621, that is, the second comparison result signals HIT_SPPR<0:N−1>.

Conversely, when the second output enable signal SPPR_EN is the low level, the NOR gate 622 may be applied with an input single of a high level, and output the second match signal MATCH_SPPR with the low level regardless of the signals outputted from the group of NAND gates 620 and 621, that is, the second comparison result signals HIT_SPPR<0:N−1>.

Figure 7:
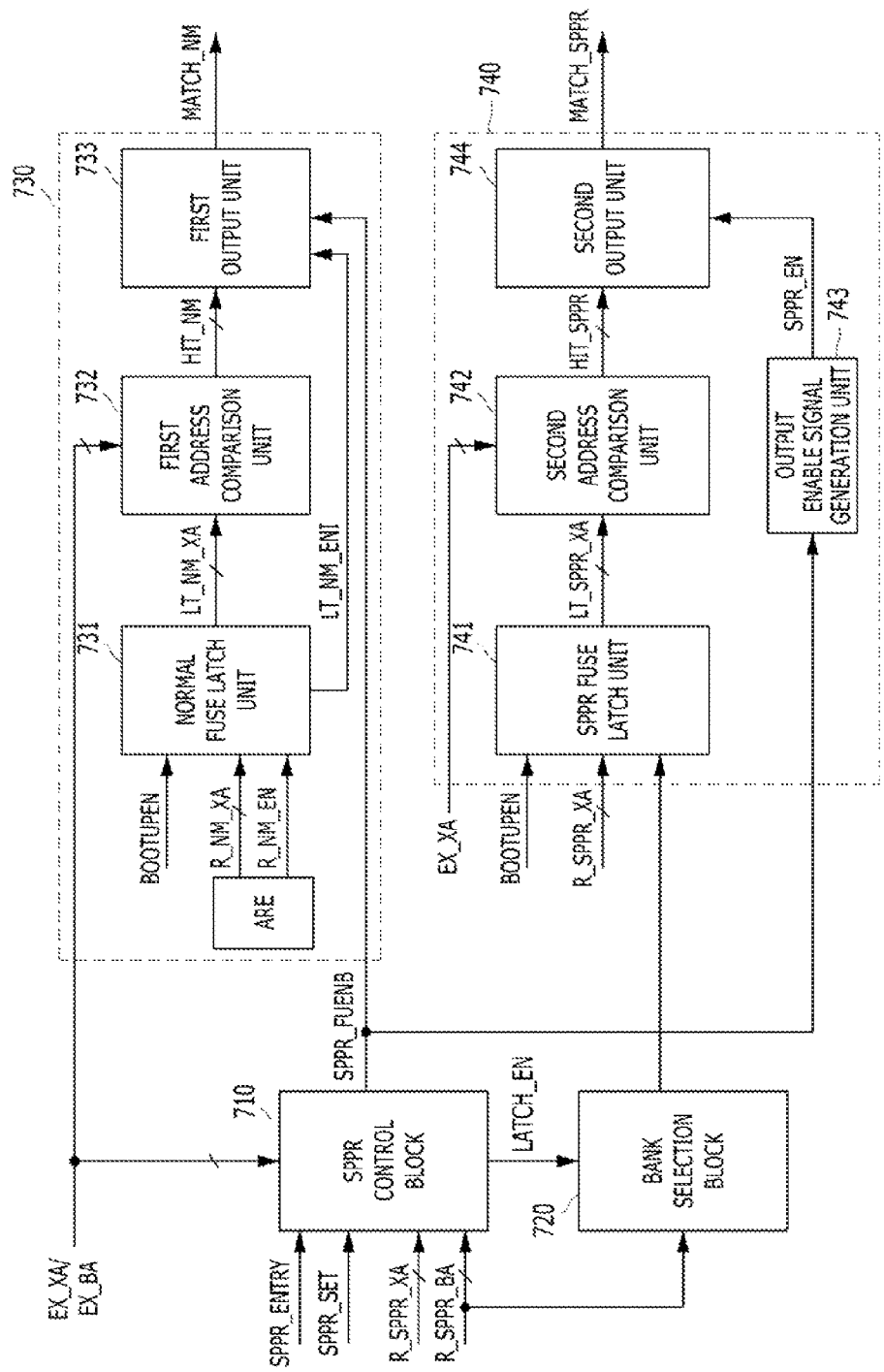
FIG. 7 is a block diagram illustrating a semiconductor memory device in accordance with an embodiment.

FIG. 7 is a block diagram illustrating a semiconductor memory device in accordance with an embodiment.

Referring to FIG. 7, the semiconductor memory device may include an SPPR control block 710, a bank selection block 720, a first fuse set block 730, and a second fuse set block 740.

The SPPR control block 710 and the bank selection block 720 may be the same as the SPPR control block 310 and the bank selection block 320 described above with reference to FIG. 3.

The first fuse set block 730 may include a fuse array ARE, a normal fuse latch unit 731, and a first match signal generation unit. The first match signal generation unit may include a first address comparison unit 732 and a first output unit 733.

The normal fuse latch unit 731 may receive a boot-up enable signal BOOTUPEN, a normal repair row address R_NM_XA, and a normal fuse set enable signal R_NM_EN. The normal repair row address R_NM_XA as an address transferred from the fuse array ARE may be repair address information corresponding to a defective memory cell that occurred at a fabrication stage of the semiconductor memory device. The normal fuse set enable signal R_NM_EN may include information on whether the fuse array ARE is programmed or not. For example, when the fuse array ARE is programmed, the normal fuse set enable signal R_NM_EN may be a high level, and, when the fuse array ARE is not programmed, the normal fuse set enable signal R_NM_EN may be a low level.

The normal fuse latch unit 731 may latch the normal repair row address R_NM_XA and the normal fuse set enable signal R_NM_EN in response to the boot-up enable signal BOOTUPEN. The normal fuse latch unit 731 may latch the normal repair row address R_NM_XA, and output a normal latch address LT_NM_XA to the first address comparison unit 732. Further, the normal fuse latch unit 731 may latch the normal fuse set enable signal R_NM_EN, and output a normal latch enable signal LT_NM_ENI to the first output unit 733.

The first address comparison unit 732 may be the same as the first address comparison unit 332 described above with reference to FIG. 3.

The first output unit 733 may receive the normal latch enable signal LT_NM_ENI, a first comparison result signal HIT_NM, and an output control signal SPPR_FUENB. The first output unit 733 may generate a first match signal MATCH_NM corresponding to the normal latch enable signal LT_NM_ENI and the first comparison result signal HIT_NM in response to the output control signal SPPR_FUENB. While not shown, whether to access a redundancy memory cell of the semiconductor memory device may be determined in response to the first match signal MATCH_NM.

For example, when an input row address EX_XA and an input bank address EX_BA are the same as an SPPR repair row address R_SPPR_XA and an SPPR repair bank address R_SPPR_BA latched in the SPPR control block 710, the output control signal SPPR_FUENB is enabled to a low level. In response to the output control signal SPPR_FUENB of the low level, the first match signal MATCH_NM may be disabled to a low level regardless of the normal latch enable signal LT_NM_ENI and the first comparison result signal HIT_NM.

Conversely, when the input row address EX_XA and the input bank address EX_BA are not the same as the SPPR repair row address R_SPPR_XA and the SPPR repair bank address R_SPPR_BA latched in the SPPR control block 710, the output control signal SPPR_FUENB is disabled to a high level. When the repair address information is programmed in the fuse array ARE, the normal fuse set enable signal R_NM_EN may be enabled to the high level. In response to the output control signal SPPR_FUENB of the high level and the normal fuse set enable signal R_NM_EN of the high level, the first output unit 733 may generate the first match signal MATCH_NM with a high level based on the first comparison result signal HIT_NM of a high level when the input row address EX_XA and the normal repair row address R_NM_XA are the same, and may generate the first match signal MATCH_NM with the low level based on the first comparison result signal HIT_NM of a low level when the input row address EX_XA and the normal repair row address R_NM_XA are not the same.

In summary, when the input row address EX_XA and the input bank address EX_BA are the same as the SPPR repair row address R_SPPR_XA and the SPPR repair bank address R_SPPR_BA latched in the SPPR control block 710, the output control signal SPPR_FUENB is enabled to the low level. At this time, the first output unit 733 may generate the first match signal MATCH_NM with the low level, even though the input row address EX_XA corresponds to a defective memory cell, that is, the input row address EX_XA and the repair address information stored in the normal fuse latch unit 731 correspond. A redundancy memory cell corresponding to the first fuse set block 730 may be disabled.

Further, when the input row address EX_XA and the input bank address EX_BA are not the same as the SPPR repair row address R_SPPR_XA and the SPPR repair bank address R_SPPR_BA latched in the SPPR control block 710, the output control signal SPPR_FUENB is disabled to the high level. At this time, the first output unit 733 may generate the first match signal MATCH_NM with the low level, when the input row address EX_XA corresponds to a normal memory cell, that is, the input row address EX_XA and the repair address information stored in the normal fuse latch unit 731 do not correspond. The normal memory cell may be accessed.

Also, when the output control signal SPPR_FUENB is disabled to the high level, the first output unit 733 may generate the first match signal MATCH_NM with the high level, when the input row address EX_XA corresponds to a defective memory cell, that is, the input row address EX_XA and the repair address information stored in the normal fuse latch unit 731 correspond. A redundancy memory cell corresponding to the first fuse set block 730 may be accessed.

The second fuse set block 740 may include an SPPR fuse latch unit 741, and a second match signal generation unit. The second match signal generation unit may include a second address comparison unit 742, an output enable signal generation unit 743, and a second output unit 744. Descriptions for the configuration of the second fuse set block 740 may be the same as those for the configuration of the second fuse set block 340 given above with reference to FIG. 3.

As a consequence, the semiconductor memory device in accordance with the embodiment may not generate a separate signal for controlling the first output unit 733, and the first match signal MATCH_NM may be disabled to the low level directly through the output control signal SPPR_FUENB.

The semiconductor memory device may prevent a malfunction that is likely to occur due to the fact that a plurality of redundancy memory cells are driven in a normal operation of the semiconductor memory device when the same repair address information is set at the wafer and package levels. Therefore, the reliability of the semiconductor memory device may increase.

Figure 8:
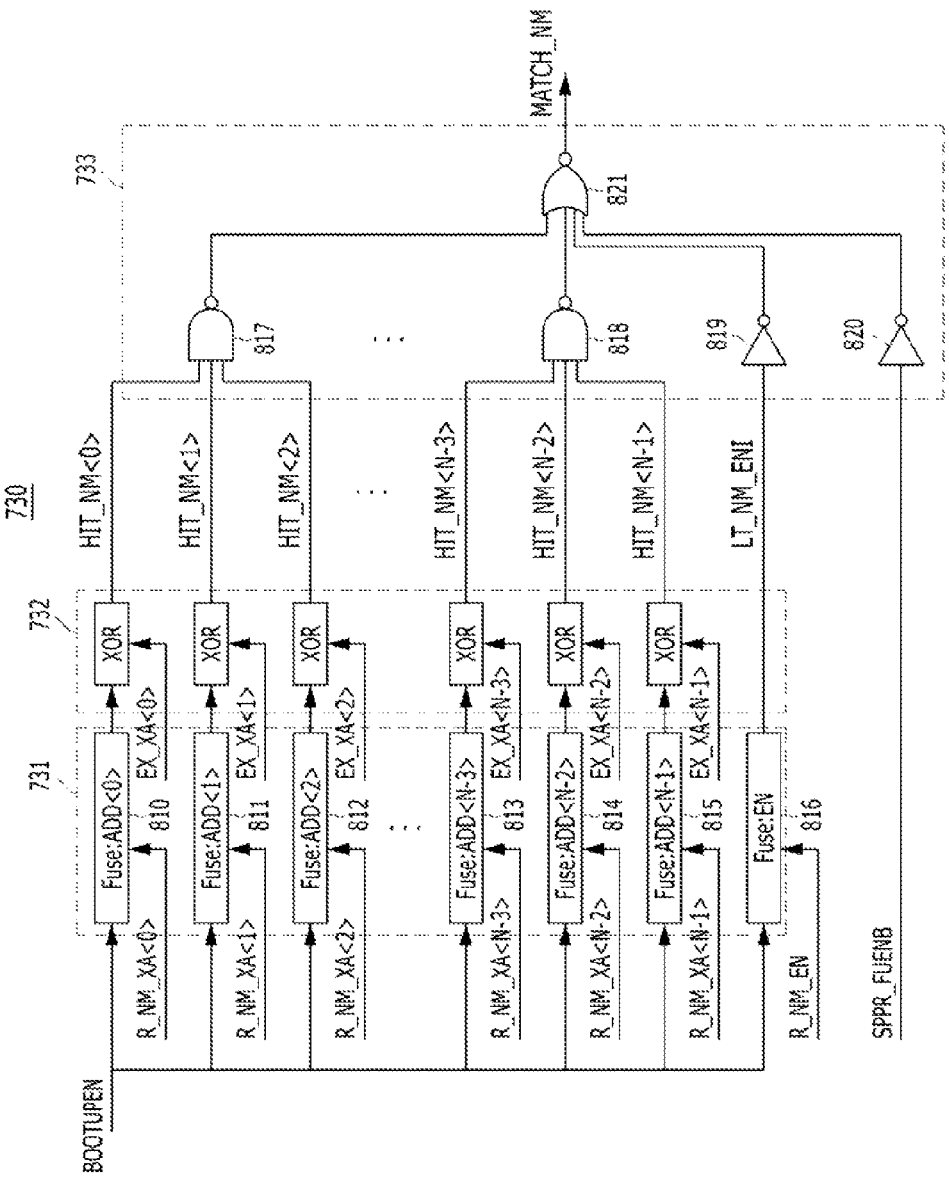
FIG. 8 is a detailed circuit diagram illustrating a first fuse set block shown in FIG. 7.

FIG. 8 is a detailed circuit diagram illustrating the first fuse set block 730 shown in FIG. 7.

Referring to FIG. 8, the first fuse set block 730 may include the normal fuse latch unit 731, the first address comparison unit 732, and the first output unit 733.

The normal fuse latch unit 731 may receive the boot-up enable signal BOOTUPEN and normal repair row addresses R_NM_XA<0:N−1> with N bits. The normal fuse latch unit 731 may include N number of first latch sections 810 to 815 for latching the normal repair row addresses R_NM_XA<0:N−1>, and a second latch section 816 for latching the normal fuse set enable signal R_NM_EN.

The first latch sections 810 to 815 of the normal fuse latch unit 731 may store the normal repair row addresses R_NM_XA<0:N−1> with N bits in response to the boot-up enable signal BOOTUPEN, and output the stored normal repair row addresses R_NM_XA<0:N−1> as normal latch addresses LT_NM_XA<0:N−1> to the first address comparison unit 732. The second latch section 816 of the normal fuse latch unit 731 may store the normal fuse set enable signal R_NM_EN in response to the boot-up enable signal BOOTUPEN, and output the stored normal fuse set enable signal R_NM_EN as the normal latch enable signal LT_NM_ENI to the first output unit 733.

The first address comparison unit 732 may include XOR gates XOR for respectively comparing the normal latch addresses LT_NM_XA<0:N−1> of N bits outputted from the N number of first latch sections 810 to 815 and input row addresses EX_XA<0:N−1>. The first address comparison unit 732 may respectively compare the normal latch addresses LT_NM_XA<0:N−1> and the input row addresses EX_XA<0:N−1>, and output N number of first comparison result signals HIT_NM<0:N−1>.

The first output unit 733 may include a group of NAND gates 817 and 818 which respectively receive the first comparison result signals HIT_NM<0:N−1> outputted from the first address comparison unit 732, a first inverter 819 which receives and inverts the normal latch enable signal LT_NM_ENI, and a second inverter 820 which receives and inverts the output control signal SPPR_FUENB. The first output unit 733 may further include a NOR gate 821 which receives the signals outputted from the group of NAND gates 817 and 818 and the signals outputted from the first and second inverters 819 and 820 and outputs the first match signal MATCH_NM.

For example, when the output control signal SPPR_FUENB is the high level, the NOR gate 821 may be applied with an input signal of a low level, and output the first match signal MATCH_NM with the high level or the low level based on the signals outputted from the group of NAND gates 817 and 818 and the output of the first inverter 819. Namely, when the output control signal SPPR_FUENB is the high level the first match signal MATCH_NM may be enabled to the high level when the input row addresses EX_XA<0:N−1> and the normal latch addresses LT_NM_XA<0:N−1> outputted from the normal fuse latch unit 731 are the same, and the first match signal MATCH_NM may be disabled to the low level when the input row addresses EX_XA<0:N−1> and the normal latch addresses LT_NM_XA<0:N−1> outputted from the normal fuse latch unit 731 are not the same.

Conversely, when the output control signal SPPR_FUENB is the low level, the NOR gate 821 may be applied with an input single of a high level, and output the first match sign MATCH_NM with the low level regardless of the signals outputted from the group of NAND gates 817 and 818 and the output of the first inverter 819. Namely, when the output control signal SPPR_FUENB is the low level, the first match signal MATCH_NM may be disabled regardless of a result of comparing the input row addresses EX_XA<0:N−1> and the normal latch addresses LT_NM_XA<0:N−1> outputted from the normal fuse latch unit 731.

The semiconductor memory device in accordance with the embodiment may perform operations according to the following method.

A method for operating a semiconductor memory device, including a first fuse set block, a second fuse set block and an SPPR control block which controls the first fuse set block and the second fuse set block, may include: storing first repair information in the SPPR control block and the second fuse set block in a soft post package repair mode; comparing an input address and the first repair information in a normal mode; and disabling the first fuse set block to Interrupt a repair operation of the first fuse set block, and enabling the second fuse set block to perform a repair operation of the second fuse set block, when it is determined as a result of the comparing that the input address and the first repair information are the same. When it is determined as the result of the comparing that the input address and the first repair information are not the same, the method may further include: comparing the input address and second repair information stored in the first fuse set block; and enabling the first fuse set block to perform the repair operation of the first fuse set block, when the input address and the second repair information are the same.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a first fuse set block including a fuse array for storing first repair information; and
    a control block suitable for storing second repair information in a first mode, and generating an output control signal when input addresses applied from an external source and the second repair information are the same, in a second mode,
    wherein the first fuse set block enables a first match signal for accessing a first redundancy memory cell when the stored first repair information and the input addresses are the same, and disables the first match signal when the output control signal is enabled regardless of whether the stored first repair information and the input addresses are the same.

2. The semiconductor memory device according to claim 1, further comprising:

a second fuse set block suitable for storing the second repair information, and enabling a second match signal for accessing a second redundancy memory cell when the second repair information and the input addresses are the same in response to the output control signal.

3. The semiconductor memory device according to claim 2, wherein the control block comprises:
a latch enable signal generation unit suitable for generating a latch enable signal when a soft-post package repair (SPPR) setting signal is enabled in the first mode;
a latch unit suitable for latching the second repair information in response to the latch enable signal;
a comparison unit suitable for comparing first latched addresses outputted from the latch unit and the input addresses, respectively; and
an output unit suitable for generating the output control signal corresponding to a comparison result from the comparison unit.

4. The semiconductor memory device according to claim 3, further comprising:
a bank selection block suitable for transferring the latch enable signal to a bank corresponding to a bank address of the second repair information in response to the latch enable signal.

5. The semiconductor memory device according to claim 3, wherein the latch unit comprises:
a bank address latch section suitable for storing a bank address of the second repair information; and
a row address latch section suitable for storing a row address of the second repair information.

6. The semiconductor memory device according to claim 3, wherein the second fuse set block comprises:
a fuse latch unit suitable for latching the second repair information in response to the latch enable signal in the first mode; and
a second match signal generation unit suitable for comparing third latched addresses outputted from the fuse latch unit and the input addresses, and generating the second match signal in response to a comparison result and the output control signal.

7. The semiconductor memory device according to claim 6, wherein the second match signal generation unit comprises:
a second address comparison unit suitable for comparing the input addresses and the third latched addresses, and generating a second comparison result signal;
a second output enable signal generation unit suitable for generating a second output enable signal in response to the output control signal; and
a second output unit suitable for generating the second match signal corresponding to the second comparison result signal in response to the second output enable signal.

8. The semiconductor memory device according to claim 1, wherein the first fuse set block comprises:
a normal fuse latch unit suitable for latching the first repair information outputted from the fuse array, in response to a boot-up enable signal; and
a first match signal generation unit suitable for comparing second latched addresses outputted from the normal fuse latch unit and the input addresses, and generating the first match signal in response to a comparison result, a normal fuse set enable signal of the first repair information and the output control signal.

9. The semiconductor memory device according to claim 8, wherein the first match signal generation unit comprises:

a first address comparison unit suitable for comparing the input addresses and the second latched addresses, and generating a first comparison result signal;
a first output enable signal generation unit suitable for generating a first output enable signal in response to the normal fuse set enable signal and the output control signal, and disabling the first output enable signal when the output control signal is enabled; and
a first output unit suitable for generating the first match signal in response to the first output enable signal and the first comparison result signal.

10. The semiconductor memory device according to claim 1, wherein the first mode is a repair operation mode performed after packaging, and the second mode is a normal operation mode.

11. A semiconductor memory device comprising:
a plurality of memory banks each including one or more first fuse set blocks for storing first repair information and one or more second fuse set blocks for storing second repair information in a first mode;
a control block suitable for generating a latch enable signal and storing row and bank addresses of the second repair information in the first mode, and generating an output control signal in a second mode when input addresses applied from an external source and the second repair information are the same; and
a bank selection block suitable for transferring the latch enable signal to a corresponding bank among the memory banks in response to the bank address,
wherein, in the second mode, the first fuse set block enables a first match signal for accessing a first redundancy memory cell when the stored first repair information and the input addresses are the same, and disables the first match signal when the output enable signal is enabled regardless of whether the stored first repair information and the input addresses are the same.

12. The semiconductor memory device according to claim 11, wherein the second fuse set block stores the row addresses of the second repair information in response to the latch enable signal, and enables a second match signal for accessing a second redundancy memory cell when the row addresses and the input addresses are the same in response to the output control signal.

13. The semiconductor memory device according to claim 11, wherein the control block comprises:
a latch enable signal generation unit suitable for generating the latch enable signal when a soft-post package repair (SPPR) setting signal is enabled in the first mode;
a latch unit suitable for latching the row and bank addresses of the second repair information in response to the latch enable signal;
a comparison unit suitable for comparing first latched addresses outputted from the latch unit and the input addresses, respectively; and
an output unit suitable for generating the output control signal corresponding to a comparison result from the comparison unit.

14. The semiconductor memory device according to claim 13, wherein the latch unit comprises:
a bank address latch section suitable for storing the bank address of the second repair information; and
a row address latch section suitable for storing the row addresses of the second repair information.

15. The semiconductor memory device according to claim 11, wherein the first fuse set block comprises:

a fuse array suitable for storing the first repair information;

a normal fuse latch unit suitable for latching the first repair information outputted from the fuse array, in response to a boot-up enable signal; and a first match signal generation unit suitable for comparing second latched addresses outputted from the normal fuse latch unit and the input addresses, and generating the first match signal in response to a comparison result, a normal fuse set enable signal of the first repair information and the output control signal.

16. The semiconductor memory device according to claim 15, wherein the first match signal generation unit comprises:

a first address comparison unit suitable for comparing the input addresses and the second latched addresses, and generating a first comparison result signal;

a first output enable signal generation unit suitable for generating a first output enable signal in response to the normal fuse set enable signal and the output control signal, and disabling the first output enable signal when the output control signal is enabled; and a first output unit suitable for generating the first match signal in response to the first output enable signal and the first comparison result signal.

17. The semiconductor memory device according to claim 11, wherein the second fuse set block comprises:

an fuse latch unit suitable for latching the second repair information in response to the latch enable signal transferred from the bank selection block in the first mode; and a second match signal generation unit suitable for comparing third latched addresses outputted from the fuse latch unit and the input addresses, and generating a second match signal in response to a comparison result and the output control signal.

18. The semiconductor memory device according to claim 17, wherein the second match signal generation unit comprises:

a second address comparison unit suitable for comparing the input addresses and the third latched addresses, and generating a second comparison result signal;

a second output enable signal generation unit suitable for generating a second output enable signal in response to the output control signal; and a second output unit suitable for generating the second match signal corresponding to the second comparison result signal in response to the second output enable signal.

* * * * *